United States Patent [19]

Ito et al.

[11] 4,314,220

[45] Feb. 2, 1982

[54] FIXING STRUCTURE OF ELECTRONIC COMPONENT

[75] Inventors: Katsuo Ito, Kanazawa; Kazunori Yoshimura, Nonoichi, both of Japan

[73] Assignee: Murata Manufacturing Co., Ltd., Japan

[21] Appl. No.: 114,496

[22] Filed: Jan. 23, 1980

[30] Foreign Application Priority Data

Feb. 9, 1979 [JP] Japan .......................... 54/16497[U]

[51] Int. Cl.³ .............................................. H01F 15/02
[52] U.S. Cl. ...................................... 336/65; 29/513; 29/515; 248/222.2; 339/126 R; 361/419; 403/242; 403/254
[58] Field of Search ................. 29/513, 515; 403/242, 403/353, 254; 248/222.2, 224.4; 361/417, 419; 336/65; 339/125, 126 R

[56] References Cited

U.S. PATENT DOCUMENTS

| | | | |
|---|---|---|---|
| 2,782,392 | 2/1957 | Stolle | 29/513 |
| 3,191,135 | 6/1965 | Hazelguist | 336/65 |
| 3,202,755 | 8/1965 | Oswald | 361/419 X |
| 3,838,203 | 9/1974 | Brandlein et al. | 361/419 X |

Primary Examiner—Thomas J. Kozma
Attorney, Agent, or Firm—Ostrolenk, Faber, Gerb & Soffen

[57] ABSTRACT

A fixing structure is disclosed for fixing an intermediate frequency transformer or other electronic component to a flexible and deformable base plate. The component comprises a base portion for fixing it to the base plate and the base plate is formed with an aperture for receiving the base portion. The base plate includes a strip portion extending along a portion of the periphery of the aperture. The component is provided with a protrusion which extends laterally from the base portion thereof. The protrusion is so formed and so located on the base portion of the component that when the base portion is inserted into the aperture, the protrusion engages the strip portion and deforms it in a direction perpendicular to the surface of the base plate, so that the diameter of the aperture shrinks, whereby the base portion is strongly gripped by at least a portion of the periphery of the aperture.

14 Claims, 13 Drawing Figures

FIXING STRUCTURE OF ELECTRONIC COMPONENT

BACKGROUND OF THE INVENTION

1. Field of the Invention

The present invention relates to a fixing structure of an electronic component and, more particularly, to an improvement in a structure for fixing an electronic component to a suitable base plate of a tuner, for example.

2. Description of the Prior Art

FIG. 1 is a view showing a fixing structure of a conventional intermediate frequency transformer. The intermediate frequency transformer 1 used in a tuner, for example, comprises a bobbin 2 made of resin, which has a base portion 3 configured to provide elasticity in a radial direction. On the other hand, a suitable base plate 4 of a tuner or the like is formed with an aperture 5 for receiving the above described base portion 3. The base portion 3 of the intermediate frequency transformer 1 is pressure inserted into the aperture 5 in the arrow 6 direction by the use of the above described elasticity, whereby the intermediate frequency transformer 1 is fixed to the base plate 4. For the purpose of reinforcement, an adhesive agent 7 is further coated thereon.

However, on the occasion of the above described pressure insertion, it often happens that the bobbin 2 is buckled, as shown by the dotted line, which causes external deformation and renders the bobbin 2 unusable. This is caused by differences of the geometry of the base portion 3 and the aperture 5, because the relatively soft bobbin 2 can not withstand an increased pressure inserting force. Furthermore, it is tiresome to coat the adhesive agent 7.

On the other hand, a conventional typical tuner employs a rotary switch structure, which is large sized and hence provides a spacious room, and the thickness t of the base plate 4 is large to provide the necessary strength, with the result that the fixing means of the intermediate frequency transformer 1 had to be as described above. A conventional thickness t is approximately 1.0 mm and the total thickness T including the base portion 3 is approximately 3.0 mm. However, as is typically the case with the recent electronic tuners, in the light of a tendency toward miniaturization, there came to be demand for a thin type of structure wherein the above described thicknesses t and T are small.

FIG. 2 is a perspective view showing an outline of an electronic tuner. The electronic tuner 8 is shown in the drawing with an upper surface housing portion omitted. The electronic tuner 8 comprises a casing for shielding from the outside including a frame member 9 having a U-letter shape and a terminal plate 10. The inside of the casing is further divided by a plurality of shield plates 11, 12 and 13. An intermediate frequency transformer 1 is fixed in the above described manner to the shield plate 11. Accordingly, the shield plate 11 corresponds to the above described base plate 4. From the above description of the conventional manner of fixing the intermediate frequency transformer 1, it will be appreciated how important reduction of the values t and T in FIG. 1 is in a miniaturized electronic tuner 8.

SUMMARY OF THE INVENTION

Accordingly, a principal object of the present invention is to provide an improved fixing structure of an electronic component which is capable of advantageously fixing an electronic component to a thin base plate.

Another object of the present invention is to provide a fixing structure of an electronic component which is capable of simply and securely fixing an electronic component to a base plate by the use of the flexibility of a thin base plate.

A further object of the present invention is to provide a fixing structure of an electronic component which is capable of fixing an electronic component in a compact and space saving manner in a miniaturized electronic apparatus.

In accordance with the present invention, a fixing structure of an electronic component is provided which can be advantageously applied to a base plate which is made very thin on the occasion of miniaturization of an electronic apparatus such as an electronic tuner, wherein various electronic components such as an intermediate frequency transformer are mounted.

In summary, the present invention comprises a fixing structure of an electronic component, wherein the base portion of the electronic component is provided with a protrusion, which is adapted to abut against a strip portion formed along a portion of the periphery of an aperture of a flexible base plate to bend the strip portion. This deformation draws the ends of the strip portion together, thereby causing the diameter of the aperture to shrink, as a result of which the base portion is strongly gripped by at least a portion of the periphery of the aperture. Thus the present invention takes advantage of the thinness of the base plate.

In a preferred embodiment of the present invention, the above described base portion has an offset stacked configuration comprising a large and a small diameter portion. The protrusion is formed to extend from the small diameter portion, and is spaced apart from the offset portion between the small and large diameter portions by a first distance, and the base plate has a thickness larger than the first distance. In fixing the electronic component to the base plate, one end of the base portion is inserted into the aperture of the base plate to bring the protrusion to the rear side of the base plate, so that the protrusion abuts against the strip portion. The electronic component is then rotated as a whole into the aperture, with the portion thereof where the large diameter portion is in contact with the base plate serving as a fulcrum, so that the strip portion is bent upward as the electronic component is turned. When the fixing process is completed, the small diameter portion is accommodated by the aperture, while the offset portion of the large diameter portion is in contact with the base plate. In such a state, the protrusion serves to bend the strip portion by an amount equal to the difference between the first and second distances. The deformation of the strip portion causes the diameter of the aperture to shrink, whereby the base portion of the electronic component comes to be gripped by at least a portion of the periphery of the aperture, with the result that the electronic component is held by the base plate.

In another preferred embodiment of the present invention, another fixing means is provided for fixing the base portion to the base plate at the side opposite to the side where the protrusion is formed. Preferably, the above described other fixing means comprises an engaging piece formed in advance and integral with the base plate, so that deformation of the above described engaging piece serves to engage the base plate with a predetermined portion of the base portion.

These and other objects, features, aspects and advantages of the present invention will become more apparent from the following detailed description of the present invention when taken in conjunction with the accompanying drawings.

BRIEF DESCRIPTION OF THE DRAWINGS

FIGS. 3 to 10 are views for explaining one embodiment of the present invention, wherein FIGS. 3, 7, 8 and 10 show in succession the fixing steps, and FIGS. 4 to 6 and 9 are views for explaining the dimensional relation; and FIGS. 11 to 13 are views for explaining another embodiment of the present invention, wherein FIG. 11 is a perspective view showing a base plate in an enlarged manner, and FIGS. 12 and 13 are views showing the fixing steps in an outline manner.

DESCRIPTION OF THE PREFERRED EMBODIMENTS

In the following one embodiment of the present invention will be described in connection with the fixing structure of an intermediate frequency transformer, by way of an example of an electronic component to which the present invention is applicable.

FIGS. 3 to 10 are views for explaining one embodiment of the present invention, wherein FIGS. 3, 7, 8 and 10 show in succession the fixing steps, and FIGS. 4 to 6 and 9 are views for explaining the associated geometry.

Figure 1:
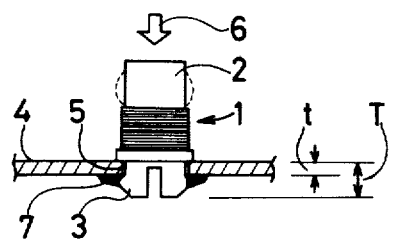
FIG. 1 is a view showing a fixing structure of a conventional intermediate frequency transformer.
Figure 2:
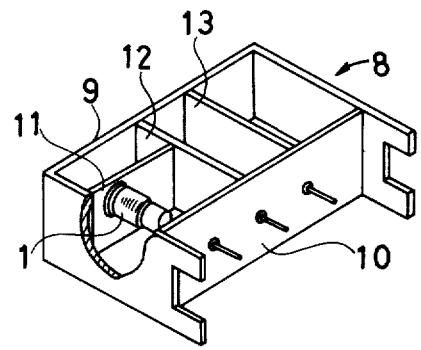
FIG. 2 is an outline perspective view of an electronic tuner.
Figure 3:
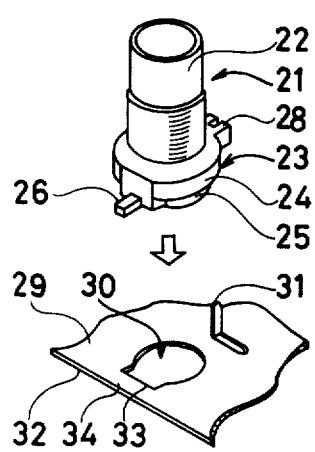
Figure 4:
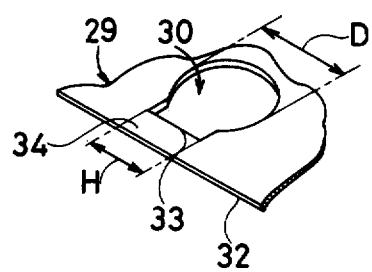
Figure 5:
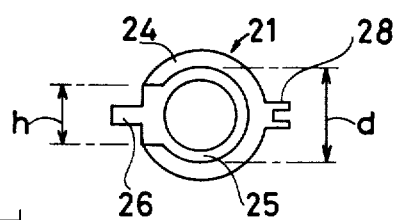
Figure 6:
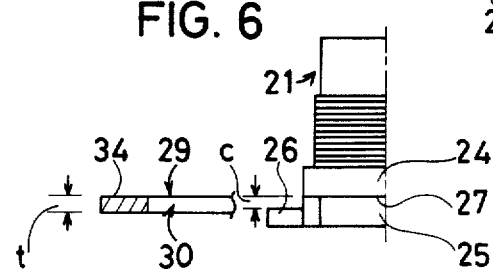

Referring to FIGS. 3 to 6, a base portion 23 formed integrally with the bobbin 22 of an intermediate frequency transformer 21 has a large diameter portion 24 and a small diameter portion 25 configured such that the small diameter portion 25 is offset stacked beneath the large diameter portion 24. The configuration of the small diameter portion 25 is best seen in FIG. 5, showing the bottom view of the intermediate frequency transformer 21. The dimensions of various portions of the small diameter portion 25 are selected to be d and h as shown in FIG. 5. A protrusion 26 is formed laterally protruding from the portion corresponding to the small diameter portion 25 of the base portion 23. The location where the protrusion 26 is provided is, as best seen in FIG. 6 showing semi-elevational view of the intermediate frequency transformer 21, selected such that the upper surface (as viewed in FIG. 6) of the protrusion 26 is positioned spaced apart by the distance e from the offset portion 27 with respect to the large diameter portion 24.

Meanwhile, a piece 28 is provided extending from the large diameter portion 24 in the direction opposite to that of the protrusion 26.

On the other hand, the base plate 29 is made of a thin plate of a material such as iron, and is formed with an aperture 30 by punching and with an engaging piece 31 by cutting. The aperture 30 has a keyhole shape which is closely similar to the configuration of the above described small diameter portion 25. The aperture 30 has a straight-edged portion 33 which is positioned adjacent the end edge 32 of the base plate 29, to which the straight-edged portion 33 is parallel. Accordingly, a strip portion 34 is formed between the straight-edged portion 33 and the end edge 32. The geometry of the aperture 30 is selected to have the dimensions D and H, as shown in FIG. 4, which shows in a locally enlarged manner a perspective view of the base plate 29. The thickness t of the base plate 29 is seen in FIG. 6, which shows a sectional view thereof. The thickness t is selected to be say approximately 0.3 mm. A mutual relation of the respective dimensions so far described is selected as follows:

$$e < t, d < D, h < H$$

Figure 7:
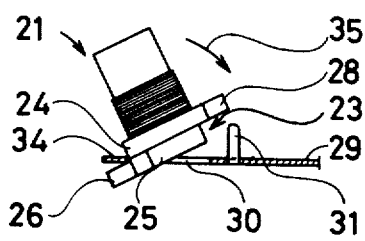

Referring to FIG. 7, one end of the base portion 23 is inserted into the aperture 30 to bring the protrusion 26 to the rear side (the lower side in the figure) of the base plate 29 to make the strip portion 34 and the protrusion 26 contact. The intermediate frequency transformer 21 is then turned as a unit in the arrow 35 direction, maintaining a portion of the large diameter portion 24 in contact with the base plate 29 as a fulcrum. As the transformer is turned, the strip portion 34 is bent upward by the protrusion 26. Then, as shown in FIG. 8, the small diameter portion 25 is fully fitted into the aperture 30 (for example see FIG. 7), so that a state is reached in which the offset portion 27 of the large diameter portion 24 is placed in contact with the base plate 29.

Figure 8:
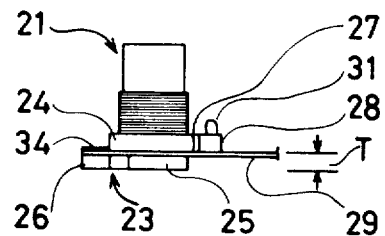
Figure 9:
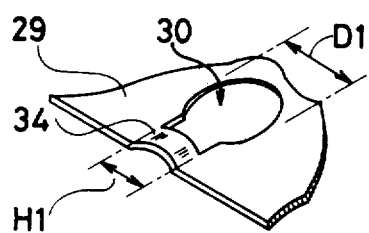

Deformation of the base plate 29 in the above described FIG. 8 state is best shown in FIG. 9. More specifically, the strip portion 34 is bent upward, which is by virtue of the above described dimensional relation $e < t$, so that the strip portion 34 is bent by the difference between e and t. Accordingly, the dimensions of the aperture 30 become D1 and H1, which are respectively smaller than the above described value D and H. Accordingly, the relation of the dimensions of the respective portions of the base plate 23 of the intermediate frequency transformer 21 and the aperture 30 becomes as follows:

$$d = D1, h = H1$$

wherein the small diameter portion 25 of the base portion 23 is nipped by at least a portion of the periphery of the aperture 30 and is advantageously held with respect to the base plate 29.

Figure 10:
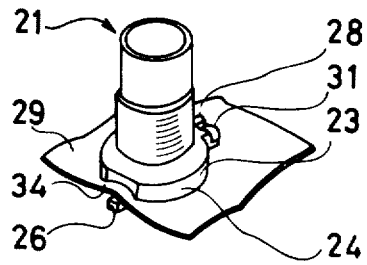

Referring to FIG. 10, by crimping the engaging piece 31 as positioned relative to the piece 28 engaged therewith, the bobbin 21 is more securely fixed to plate 29.

According to the embodiment shown, the dimension T shown in FIG. 8 may be approximately 1.4 mm, which is much less than the conventional thickness of approximately 3.0 mm.

Figure 11:
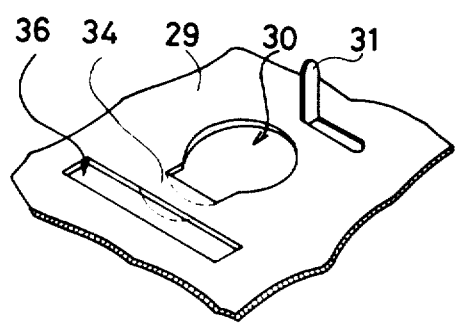
Figure 12:
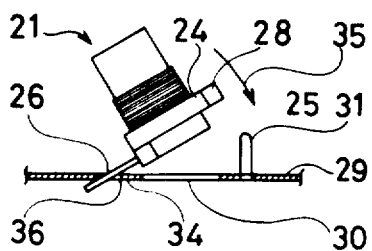
Figure 13:
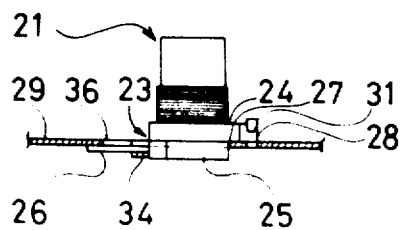

FIGS. 11 to 13 are views for explaining another embodiment of the present invention, wherein FIG. 11 is a perspective view showing the base plate in an enlarged manner and FIGS. 12 and 13 are views showing fixing steps in an outline manner. Referring to FIGS. 11 to 13, those portions corresponding to the portions shown in FIGS. 3 to 10 are denoted by like reference characters and a repeated description thereof is omitted.

Referring to FIG. 11, the strip portion 34 is formed without utilizing the edge of the base plate 29 per se but by forming a slit 36. Such structure is advantageous when the aperture 30 must be formed at a position far from the edge of the base plate 29.

Referring to FIG. 12, the protrusion 26 is formed to be relatively long. The location for formation of the protrusion 26 is selected to leave a proper dimension at both end portions in the thick direction of the small diameter portion 25. The protrusion 26 is inserted into the slit 36 and then the intermediate frequency transformer 21 is turned as a whole in the arrow 35 direction. As the turning proceeds, the strip portion 34 is bent as shown by the dotted line in FIG. 11. More specifically, the strip portion 34 is bent downward. As the strip portion 34 is deformed, the aperture 30 shrinks, as in the above described case.

Referring to FIG. 13, ultimately the tip end of the protrusion 26 is positioned on the rear side of the base plate 29 and the curved strip portion 34 is located further beneath the protrusion 26.

The above described embodiments were depicted as employing separate securing means for fixing the intermediate frequency transformer 21 by crimping the engaging piece 31 on the surface opposite to the surface where the protrusion 26 is provided. By way of such securing means, alternatively a screw, an adhesive agent, or the like may be utilized. However, such separate securing means is merely intended to perform a reinforcing purpose and the essential feature of the inventive fixing structure resides in nipping the base portion by virtue of shrinkage of the diameter of the aperture because of bending of the strip portion.

Although the foregoing various embodiments were described as employed in fixing an intermediate frequency transformer, the present invention can be widely applied in fixing any other type of electronic components.

As described in the foregoing, according to the present invention, since an electronic component can be advantageously fixed by bending a base plate for fixing an electronic component, the thickness of the base plate per se is rather preferably thinner, which accordingly enables implementation of a light weight and space-saving implementation, which enables advantageous utilization in a much miniaturized apparatus such as an electronic tuner, for example. Furthermore, work for fixing an electronic component can be carried out with extreme simplicity.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A structure for fixing an electronic component to a flexible and deformable base plate, said structure comprising:
   (A) an electronic component;
   (B) base plate means made of a flexible and deformable material; said base plate means having an aperture formed therein for receiving said electronic component; and said base plate means further including a strip portion extending along a portion of the periphery of said aperture and having a direction of extension; and
   (C) said electronic component including:
   (1) a base portion for insertion into said aperture, said base portion being so formed that it can be inserted into said aperture only a predetermined distance; and
   (2) a protrusion extending from said base portion; said protrusion and said strip portion cooperating in such a manner that when said base portion is inserted into said aperture, said protrusion engages said strip portion and deforms said strip portion in a manner such that the width of said aperture as measured in the direction parallel to said direction of extension of said strip portion is reduced to such an extent that said base portion is gripped by at least a portion of the periphery of said aperture, whereby said electronic component is secured firmly in said aperture.

2. A fixing structure in accordance with claim 1, wherein said base portion has a large diameter portion and a small diameter portion that are coaxial with and continuous with each other to form an offset stacked configuration.

3. A fixing structure in accordance with claim 2, wherein said protrusion is formed to extend from said small diameter portion.

4. A fixing structure in accordance with claim 3, wherein said protrusion is spaced apart from the point of junction between said small and large diameter portions by a first distance, and wherein said base plate means has a thickness larger than said first distance, whereby said protrusion serves to deform said strip portion by an amount equal to the difference between said first distance and said thickness, with said small diameter portion being accommodated in said aperture and the offset portion between said small and large diameter portions being in contact with said base plate means.

5. A fixing structure in accordance with claim 1, wherein said base plate means has an edge and said aperture is formed in the vicinity of said edge of said base plate means, said strip portion being defined between a portion of the periphery of said aperture and a portion of said edge of said base plate means.

6. A fixing structure in accordance with claim 1, wherein said base plate means has a slit formed therein and extending parallel to a portion of the periphery of said aperture, said strip portion being defined between a portion of the periphery of said aperture and a portion of the periphery of said slit.

7. A fixing structure in accordance with claim 6, wherein said base plate means has a front surface and a reverse surface, said electronic component being inserted into said aperture in a direction from said front to said reverse surface, and wherein said protrusion is longer than the combined widths of said strip portion and said slit, said protrustion having an end inserted into said slit and abutting said reverse surface of said base plate means, whereby said strip portion is deformed in the direction in which said electronic component is inserted into said aperture.

8. A fixing structure in accordance with claim 1, wherein said protrusion has a length less than the width of said strip portion.

9. A fixing structure in accordance with claim 1, which further comprises additional fixing means for fixing said base portion to said base plate means at a location on said base portion opposite to the side thereof where said protrusion is formed.

10. A fixing structure in accordance with claim 9, wherein said additional fixing means comprises a piece formed on said base portion, and an engaging piece formed on said base plate means and engaging said piece when said strip portion has been deformed.

11. A fixing structure in accordance with claim 9, wherein said additional fixing means comprises an adhesive agent.

12. A fixing structure in accordance with claim 9, wherein said additional fixing means comprises a screw.

13. A fixing structure in accordance with claim 1, wherein said electronic component comprises an intermediate frequency transformer.

14. A process for securing an electronic component to a flexible and deformable base plate, comprising the steps of:

provrding a base plate made of a flexible and deformable material and having an aperture formed therein;

providing an electronic component that includes a base portion that has an offset defining a small diameter portion for insertion into said aperture and a large diameter portion which is too large to fit through said aperture, said base portion further having a protrusion extending from said small diameter portion parallel to said offset, the distance between said protrusion and said offset being less than the thickness of said base plate so that when said electronic component is inserted into said aperture that said base plate will be deformed, as a result of the insertion of said electronic component into said aperture, in such a manner as to cause said electronic component to be tightly gripped by at least a portion of the periphery of said aperture; and inserting said electronic component into said aperture in such a manner as to deform said base plate so as to cause at least a portion of the periphery of said aperture to grip said electronic component firmly, thereby to secure said electronic component in said aperture.

* * * * *